United States Patent
Ippen et al.

(10) Patent No.: US 11,753,587 B2
(45) Date of Patent: Sep. 12, 2023

(54) METHOD FOR SYNTHESIS OF BLUE-EMITTING ZNSE1-XTEX ALLOY NANOCRYSTALS

(71) Applicant: NANOSYS, Inc., Milpitas, CA (US)

(72) Inventors: Christian Ippen, Sunnyvale, CA (US); Jonathan Truskier, Oakland, CA (US); Jesse Manders, Mountain View, CA (US)

(73) Assignee: NANOSYS, Inc., Milpitas, CA (US)

( * ) Notice: Subject to any disclaimer, the term of this patent is extended or adjusted under 35 U.S.C. 154(b) by 960 days.

(21) Appl. No.: 16/422,242

(22) Filed: May 24, 2019

(65) Prior Publication Data

US 2019/0390109 A1    Dec. 26, 2019

Related U.S. Application Data

(60) Provisional application No. 62/677,853, filed on May 30, 2018.

(51) Int. Cl.

| | | |
|---|---|---|
| C09K 11/88 | (2006.01) | |
| C01B 19/00 | (2006.01) | |
| C09K 11/02 | (2006.01) | |
| B82Y 20/00 | (2011.01) | |
| B82Y 30/00 | (2011.01) | |
| B82Y 35/00 | (2011.01) | |
| B82Y 40/00 | (2011.01) | |

(52) U.S. Cl.
CPC .......... *C09K 11/883* (2013.01); *C01B 19/007* (2013.01); *C09K 11/02* (2013.01); *B82Y 20/00* (2013.01); *B82Y 30/00* (2013.01); *B82Y 35/00* (2013.01); *B82Y 40/00* (2013.01); *C01P 2002/60* (2013.01); *C01P 2002/84* (2013.01); *C01P 2006/60* (2013.01)

(58) Field of Classification Search
CPC .................................................. C09K 11/883
See application file for complete search history.

(56) References Cited

U.S. PATENT DOCUMENTS

| | | |
|---|---|---|
| 6,207,229 B1 | 3/2001 | Bawendi et al. |
| 6,225,198 B1 | 5/2001 | Alivisatos et al. |
| 6,322,901 B1 | 11/2001 | Bawendi et al. |
| 6,501,091 B1 | 12/2002 | Bawendi et al. |

(Continued)

FOREIGN PATENT DOCUMENTS

| | | |
|---|---|---|
| EP | 2 616 522 A1 | 7/2013 |
| JP | 2018115315 A | 7/2018 |

(Continued)

OTHER PUBLICATIONS

Hou. 1-Hexadecylamine as both reducing agent and stabilizer to synthesize Au and Ag nanoparticles and their SERS application. J Nanopart Res (2011) 13:1929-1936 (Year: 2011).*

(Continued)

*Primary Examiner* — Matthew E. Hoban
(74) *Attorney, Agent, or Firm* — EIP US LLP

(57) ABSTRACT

The invention relates to highly luminescent nanostructures, particularly highly luminescent nanostructures comprising a $ZnSe_{1-x}Te_x$ core and ZnS and/or ZnSe shell layers. The invention also relates to methods of producing such nanostructures.

11 Claims, 3 Drawing Sheets

(56) References Cited

U.S. PATENT DOCUMENTS

| | | |
|---|---|---|
| 6,607,829 B1 | 8/2003 | Bawendi et al. |
| 6,803,719 B1 | 10/2004 | Miller et al. |
| 6,861,155 B2 | 3/2005 | Bawendi et al. |
| 7,060,243 B2 | 6/2006 | Bawendi et al. |
| 7,068,898 B2 | 6/2006 | Buretea et al. |
| 7,125,605 B2 | 10/2006 | Bawendi et al. |
| 7,374,807 B2 | 5/2008 | Parce et al. |
| 7,374,824 B2 | 5/2008 | Bawendi et al. |
| 7,566,476 B2 | 7/2009 | Bawendi et al. |
| 7,572,395 B2 | 8/2009 | Whiteford et al. |
| 7,645,397 B2 | 1/2010 | Parce et al. |
| 8,101,234 B2 | 1/2012 | Bawendi et al. |
| 8,143,703 B2 | 3/2012 | Heald et al. |
| 8,158,193 B2 | 4/2012 | Bawendi et al. |
| 8,425,803 B2 | 4/2013 | Parce et al. |
| 8,563,133 B2 | 10/2013 | Whiteford et al. |
| 8,637,082 B2 | 1/2014 | Tulsky et al. |
| 8,916,064 B2 | 12/2014 | Liu et al. |
| 9,005,480 B2 | 4/2015 | Furuta et al. |
| 9,139,770 B2 | 9/2015 | Freeman et al. |
| 9,169,435 B2 | 10/2015 | Guo et al. |
| 2005/0205849 A1 | 9/2005 | Whiteford et al. |
| 2007/0034833 A1 | 2/2007 | Parce et al. |
| 2007/0273275 A1 | 11/2007 | Jang et al. |
| 2008/0105855 A1 | 5/2008 | Buretea et al. |
| 2008/0118755 A1 | 5/2008 | Whiteford et al. |
| 2008/0237540 A1 | 10/2008 | Dubrow |
| 2009/0065764 A1 | 3/2009 | Heald et al. |
| 2010/0110728 A1 | 5/2010 | Dubrow et al. |
| 2010/0140551 A1 | 6/2010 | Parce et al. |
| 2010/0155749 A1 | 6/2010 | Chen et al. |
| 2010/0276638 A1 | 11/2010 | Liu et al. |
| 2011/0262752 A1 | 10/2011 | Bawendi et al. |
| 2011/0263062 A1 | 10/2011 | Bawendi et al. |
| 2011/0300076 A1* | 12/2011 | Tulsky .................. B82Y 30/00 435/7.8 |
| 2012/0113672 A1 | 5/2012 | Dubrow et al. |
| 2013/0345458 A1 | 12/2013 | Freeman et al. |
| 2014/0001405 A1 | 1/2014 | Guo et al. |
| 2014/0151600 A1 | 6/2014 | Liu et al. |
| 2014/0264189 A1 | 9/2014 | Furuta et al. |
| 2015/0344776 A1 | 12/2015 | Bootman |
| 2017/0037314 A1 | 2/2017 | Nam et al. |
| 2017/0066965 A1 | 3/2017 | Truskier et al. |
| 2018/0327665 A1* | 11/2018 | Lee ......................... C09K 11/02 |
| 2019/0276737 A1* | 9/2019 | Won ....................... H01L 51/502 |

FOREIGN PATENT DOCUMENTS

| | | |
|---|---|---|
| JP | 2019157129 A | 9/2019 |
| WO | WO 2010/040032 A2 | 4/2010 |

OTHER PUBLICATIONS

Ning, J., et al., "Magic Size InP and InAs Clusters: Synthesis, Characterization and Shell Growth," *Chem. Commun.* 55:2626-2629, Royal Society of Chemistry, United Kingdom (2017).

Price, S.C., et al., "Formation of Ultra-Thin Quantum Dot Films by Mist Deposition," *ECS Transactions* 11:89-94, The Electrochemical Society, United States (2007).

Wang, A., et al., "Bright, efficient, and color-stable violet ZnSe-based quantum dot light-emitting diodes," *Nanoscale* 7:2951-2959, Royal Society of Chemistry, United Kingdom (2015).

Zhang, J., et al., "Shape-Control of ZnTe Nanocrystal Growth in Organic Solution," *J. Phys. Chem. C* 112:5454-5458, American Chemical Society, United States (2008).

Adegoke, O0., et al., "Optical properties of water-soluble l-cysteine-capped alloyed CdSeS quantum dot passivated with ZnSeTe and ZnSeTe/ZnS shells," Optical Materials 46:548-554, Elsevier B.V., Netherlands (2015).

Chia, C.-H., et al., "Radiative recombination of indirect exciton in type-II ZnSeTe/ZnSe multiple quantum wells," Journal of Luminescence 131:956-959, Elsevier B.V., Netherlands (2011).

International Search Report and Written Opinion for International Application No. PCT/US2019/033795, European Patent Office, Netherlands, dated Sep. 18, 2019, 13 pages.

* cited by examiner

METHOD FOR SYNTHESIS OF BLUE-EMITTING ZNSE1-XTEX ALLOY NANOCRYSTALS

BACKGROUND OF THE INVENTION

Field of the Invention

The invention pertains to the field of nanotechnology. More particularly, the invention relates to highly luminescent nanostructures, particularly highly luminescent nanostructures comprising a $ZnSe_{1-x}Te_x$ core and ZnS and/or ZnSe shell layers. The invention also relates to methods of producing such nanostructures.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs), lasers, and biomedical labeling. Highly luminescent nanostructures are particularly desirable for such applications.

To exploit the full potential of nanostructures in applications such as LEDs and displays, the nanostructures need to simultaneously meet five criteria: narrow and symmetric emission spectra, high photoluminescence (PL) quantum yields (QYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). But, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for the production of LEDs and displays.

Electroluminescent quantum dot light-emitting devices with BT.2020 color gamut require a blue-emitting quantum dot material with a peak wavelength in the range of 450 nm to 460 nm with less than a 30 nm full width at half maximum (FWHM) and high quantum yield. For regulatory compliance, the material needs to be free of cadmium and lead.

It is difficult to achieve these parameters with cadmium-free materials. As described in Ning, J., et al., *Chem. Commun.* 53:2626-2629 (2017), indium phosphide quantum dots grown from magic size clusters as the smallest imaginable core show a minimum photoluminescence peak of 460 nm (with >50 nm FWHM and low quantum yield) and red shift upon shell coating. As described in U.S. Patent Appl. No. 2017/0066965, ZnSe quantum dots can be made with very sharp emission peaks and high quantum yields at a peak wavelength of up to 435 nm, but further particle growth towards the target wavelength resulted in significant quantum yield loss due to poor electron-hole overlap in giant cores.

A need exists to prepare nanostructure compositions that have a peak wavelength in the range of 450 nm to 460 nm and have a FWHM of less than 30 nm.

BRIEF SUMMARY OF THE INVENTION

The present invention provides a nanostructure comprising a core surrounded by at least one shell, wherein the core comprises $ZnSe_{1-x}Te_x$ wherein $0<x<0.5$, wherein the at least one shell comprises ZnS or ZnSe, and wherein the full width at half maximum (FWHM) of the nanostructure is between about 10 nm and about 30 nm.

In some embodiments, the emission wavelength of the nanostructure is between 400 nm and 500 nm. In some embodiments, the emission wavelength of the nanostructure is between 420 nm and 480 nm. In some embodiments the emission wavelength of the nanostructure is between 450 nm and 460 nm.

In some embodiments, the nanostructure comprises a core surrounded by two shells. In some embodiments, at least one shell comprises ZnSe. In some embodiments, at least one shell comprises ZnS.

In some embodiments, at least one shell comprises between 3 and 5 monolayers of ZnSe. In some embodiments, at least one shell comprises about 4 monolayers of ZnSe.

In some embodiments, at least one shell comprises between 3 and 5 monolayers of ZnS. In some embodiments, at least one shell comprises about 4 monolayers of ZnS.

In some embodiments, the photoluminescence quantum yield of the nanostructure is between 30% and 99%. In some embodiments, the photoluminescence quantum yield of the nanostructure is between 50% and 60%.

In some embodiments, the FWHM of the nanostructure is between about 20 nm and about 30 nm.

In some embodiments, the nanostructure comprises two shells, wherein the first shell comprises ZnSe and the second shell comprises ZnS.

In some embodiments, the nanostructure is a quantum dot.

In some embodiments, the nanostructure is free of cadmium.

In some embodiments, a device comprises the nanostructure of the present invention.

The present invention also provides a method of producing a ZnSe1−xTex nanocrystal comprising:
(a) admixing a selenium source and at least one ligand to produce a reaction mixture; and
(b) contacting the reaction mixture obtained in (a) with a zinc source and a solution comprising a tellurium source, a reducing agent, and a zinc carboxylate; to provide a $ZnSe_{1-x}Te_x$ nanocrystal.

In some embodiments, the selenium source admixed in (a) is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, the selenium source admixed in (a) is trioctylphosphine selenide.

In some embodiments, the at least one ligand admixed in (a) is selected from the group consisting of trioctylphosphine oxide, trioctylphosphine, diphenylphosphine, triphenylphosphine oxide, and tributylphosphine oxide.

In some embodiments, the at least one ligand admixed in (a) is trioctylphosphine.

In some embodiments, the zinc source contacted with the reaction mixture in (b) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

In some embodiments, the zinc source in (b) contacted with the reaction mixture is diethylzinc.

In some embodiments, the tellurium source in (b) contacted with the reaction mixture is selected from the group consisting of trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof.

In some embodiments, the tellurium source in (b) contacted with the reaction mixture is trioctylphosphine telluride.

In some embodiments, the reducing agent in (b) contacted with the reaction mixture is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride.

In some embodiments, the reducing agent in (b) contacted with the reaction mixture is lithium triethylborohydride.

In some embodiments, the zinc carboxylate in (b) contacted with the reaction mixture is selected from the group consisting of zinc oleate, zinc hexanoate, zinc octanoate, zinc laurate, zinc myristate, zinc palmitate, zinc stearate, zinc dithiocarbamate, or mixtures thereof.

In some embodiments, the zinc carboxylate in (b) contacted with the reaction mixture is zinc oleate.

The present invention also provides a method of producing a $ZnSe_{1-x}Te_x$ nanocrystal comprising:
(a) admixing a selenium source and at least one ligand to produce a reaction mixture;
(b) contacting the reaction mixture obtained in (a) with a zinc source and a solution comprising a tellurium source, a reducing agent, and a zinc carboxylate; and
(c) contacting the reaction mixture in (b) with a zinc source and a selenium source;
to provide a $ZnSe_{1-x}Te_x$ nanocrystal.

In some embodiments, the zinc source in (c) contacted with the reaction mixture is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

In some embodiments, the zinc source in (c) contacted with the reaction mixture is diethylzinc.

In some embodiments, the selenium source in (c) contacted with the reaction mixture is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, the selenium source in (c) contacted with the reaction mixture is trioctylphosphine selenide.

In some embodiments, the admixing in (a) is at a temperature between 250° C. and 350° C. In some embodiments, the admixing in (a) is at a temperature of about 300° C.

In some embodiments, the contacting in (b) is at a temperature between 250° C. and 350° C. In some embodiments, the contacting in (b) is at a temperature of about 300° C.

In some embodiments, the contacting in (b) further comprises at least one ligand.

In some embodiments, the contacting in (c) is at a temperature between 250° C. and 350° C. In some embodiments, the contacting in (c) is at a temperature of about 300° C.

In some embodiments, the contacting in (c) further comprises at least one ligand. In some embodiments, the at least one ligand is trioctylphosphine or diphenylphosphine.

In some embodiments, the selenium source in (a) is trioctylphosphine selenide, the zinc source in (b) is diethylzinc, the tellurium source in (b) is trioctylphosphine telluride, the reducing agent in (b) is lithium triethylborohydride, and the zinc carboxylate in (b) is zinc oleate.

In some embodiments, the selenium source in (a) and (c) is trioctylphosphine selenide, the zinc source in (b) and (c) is diethylzinc, the tellurium source in (b) is trioctylphosphine telluride, the reducing agent in (b) is lithium triethylborohydride, and the zinc carboxylate in (b) is zinc oleate.

The present invention also provides a method of producing a $ZnSe_{1-x}Te_x$ nanocrystal comprising:
(a) admixing a selenium source and at least one ligand to produce a reaction mixture; and
(b) contacting the reaction mixture obtained in (a) with a zinc source and a solution comprising a tellurium source, a reducing agent, and a zinc carboxylate;
(c) contacting the reaction mixture in (b) with a zinc source and a selenium source;
(d) admixing the reaction mixture in (c) with a solution comprising a zinc source; and
(e) contacting the reaction mixture of (d) with a selenium source or a sulfur source;
to provide a $ZnSe_{1-x}Te_x$ nanocrystal.

The present invention also provides a method of producing a $ZnSe_{1-x}Te_x$ nanocrystal comprising:
(a) admixing a selenium source and at least one ligand to produce a reaction mixture; and
(b) contacting the reaction mixture obtained in (a) with a zinc source and a solution comprising a tellurium source, a reducing agent, and a zinc carboxylate; (c) contacting the reaction mixture in (b) with a zinc source and a selenium source;
(d) admixing the reaction mixture in (c) with a solution comprising a zinc source;
(e) contacting the reaction mixture of (d) with a selenium source or a sulfur source; and
(f) contacting the reaction mixture of (e) with a selenium source or a sulfur source; wherein the source used in (e) is different than the source used in (f);
to provide a $ZnSe_{1-x}Te_x$ nanocrystal.

In some embodiments, the admixing in (d) is at a temperature between 20° C. and 310° C. In some embodiments, admixing in (d) is at a temperature between 20° C. and 100° C.

In some embodiments, the zinc source of (d) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, zinc oleate, zinc hexanoate, zinc octanoate, zinc laurate, zinc myristate, zinc palmitate, zinc stearate, zinc dithiocarbamate, or mixtures thereof.

In some embodiments, the contacting in (e) is at a temperature between 200° C. and 350° C. In some embodiments, the contacting in (e) is at a temperature of about 310° C.

In some embodiments, in (e) the reaction mixture is contacted with a selenium source.

In some embodiments, the selenium source in (e) is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, in (e) the reaction mixture is contacted with a sulfur source.

In some embodiments, the sulfur source in (e) is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof.

In some embodiments, the contacting in (e) is at a temperature between 200° C. and 350° C. In some embodiments, the contacting in (e) is at a temperature of about 310° C.

In some embodiments, in (f) the reaction mixture is contacted with a selenium source.

In some embodiments, in (f) the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

In some embodiments, in (f) the reaction mixture is contacted with a sulfur source.

In some embodiments, in (f) the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof.

In some embodiments, the admixing in (d) further comprises at least one ligand. In some embodiments, the at least one ligand is selected from the group consisting of trioctylphosphine oxide, trioctylphosphine, diphenylphosphine, triphenylphosphine oxide, and tributylphosphine oxide. In some embodiments, the at least one ligand is trioctylphosphine or trioctylphosphine oxide.

DETAILED DESCRIPTION OF THE INVENTION

Definitions

Figure 1:
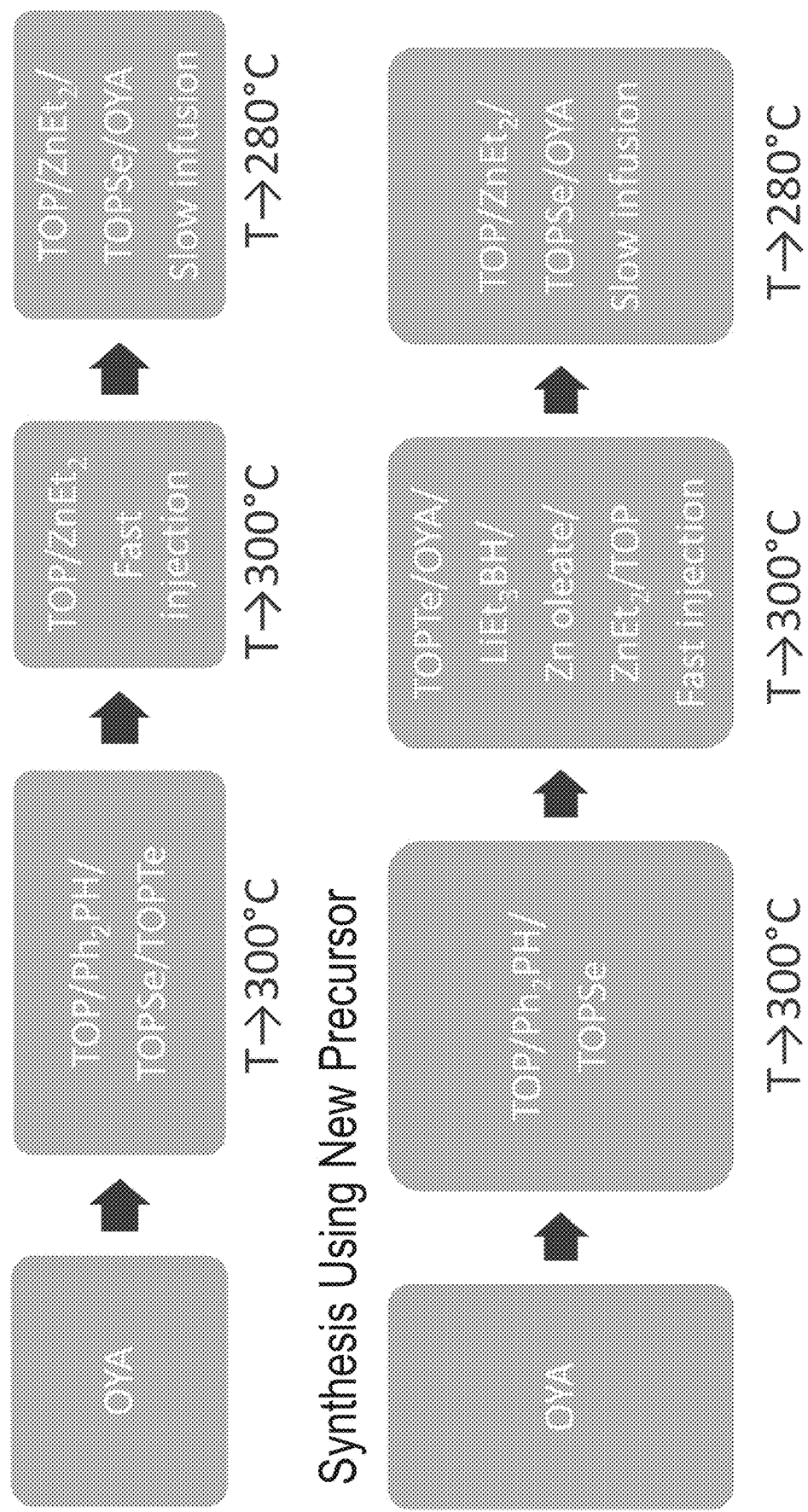
FIG. 1 are flowcharts of the synthesis of a core using the old tellurium precursor and the new tellurium precursor.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value, or +/−5% of the value, or +/−1% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "external quantum efficiency" (EQE) is a ratio of the number of photons emitted from a light emitting diode (LED) to the number of electrons passing through the device. The EQE measures how efficiently a LED converts electrons to photons and allows them to escape. EQE can be measured using the formula:

EQE=[injection efficiency]×[solid-state quantum yield]×[extraction efficiency]

where:
injection efficiency=the proportion of electrons passing through the device that are injected into the active region;
solid-state quantum yield=the proportion of all electron-hole recombinations in the active region that are radiative and thus, produce photons; and
extraction efficiency=the proportion of photons generated in the active region that escape from the device.

Unless clearly indicated otherwise, ranges listed herein are inclusive.

A variety of additional terms are defined or otherwise characterized herein.

Production of Nanostructures

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei.

Surfactant molecules interact with the surface of the nanostructure. At the growth temperature, the surfactant molecules rapidly adsorb and desorb from the nanostructure surface, permitting the addition and/or removal of atoms from the nanostructure while suppressing aggregation of the growing nanostructures. In general, a surfactant that coordinates weakly to the nanostructure surface permits rapid growth of the nanostructure, while a surfactant that binds more strongly to the nanostructure surface results in slower nanostructure growth. The surfactant can also interact with one (or more) of the precursors to slow nanostructure growth.

Nanostructure growth in the presence of a single surfactant typically results in spherical nanostructures. Using a mixture of two or more surfactants, however, permits growth to be controlled such that non-spherical nanostructures can be produced, if, for example, the two (or more) surfactants adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

Synthesis of Group II-VI nanostructures has been described, e.g., in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and U.S. Patent Appl. Publication Nos. 2011/0262752 and 2011/0263062.

Although Group II-VI nanostructures such as CdSe/CdS/ZnS core/shell quantum dots can exhibit desirable luminescence behavior, as noted above, issues such as the toxicity of cadmium limit the applications for which such nanostructures can be used. Less toxic alternatives with favorable luminescence properties are thus highly desirable.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, is measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

Production of the $ZnSe_{1-x}Te_x$ Core

The nanostructure comprises a $ZnSe_{1-x}Te_x$ core and a ZnS shell, a ZnSe shell, or a combination thereof. In some embodiments, the nanostructure is a $ZnSe_{1-x}Te_x$/ZnSe/ZnS core/shell nanostructure.

In some embodiments, the nanostructure comprises a $ZnSe_{1-x}Te_x$ core, wherein $0<x<0.5$, $0<x<0.25$, $0<x<0.1$, $0<x<0.05$, $0<x<0.02$, $0<x<0.01$, $0.01<x<0.5$, $0.01<x<0.25$, $0.01<x<0.1$, $0.01<x<0.05$, $0.01<x<0.02$, $0.02<x<0.5$, $0.02<x<0.25$, $0.02<x<0.1$, $0.02<x<0.05$, $0.05<x<0.5$, $0.05<x<0.25$, $0.05<x<0.1$, $0.1<x<0.5$, $0.1<x<0.25$, or $0.5<x<0.25$.

As used herein, the term "nucleation phase" refers to the formation of a $ZnSe_{1-x}Te_x$ core nucleus. As used herein, the term "growth phase" refers to the growth process of applying layers of ZnSe or ZnS to the core nucleus.

The diameter of the $ZnSe_{1-x}Te_x$ core can be controlled by varying the amount of precursors provided. The diameter of the $ZnSe_{1-x}Te_x$ core can be determined using techniques known to those of skill in the art. In some embodiments, the diameter of the $ZnSe_{1-x}Te_x$ core is determined using transmission electron microscopy (TEM).

In some embodiments, each $ZnSe_{1-x}Te_x$ core has a diameter of between about 1.0 nm and about 7.0 nm, about 1.0 nm and about 6.0 nm, about 1.0 nm and about 5.0 nm, about 1.0 nm and about 4.0 nm, about 1.0 nm and about 3.0 nm, about 1.0 nm and about 2.0 nm, about 2.0 nm and about 7.0 nm, about 2.0 nm and about 6.0 nm, about 2.0 nm and about 5.0 nm, about 2.0 nm and about 4.0 nm, about 2.0 nm and about 3.0 nm, about 3.0 nm and about 7.0 nm, about 3.0 nm and about 6.0 nm, about 3.0 nm and about 5.0 nm, about 3.0 nm and about 4.0 nm, about 4.0 nm and about 7.0 nm, about 4.0 nm and about 6.0 nm, about 4.0 nm and about 5.0 nm, about 5.0 nm and about 7.0 nm, about 5.0 nm and about 6.0 nm, or about 6.0 nm and about 7.0 nm. In some embodiments, the ZnSe$_{1-x}$Te$_x$ core has a diameter of between about 3.0 nm and about 5.0 nm.

In some embodiments, the present invention provides a method of producing a ZnSe$_{1-x}$Te$_x$ nanocrystal comprising:
  (a) admixing a selenium source and at least one ligand to produce a reaction mixture; and
  (b) contacting the reaction mixture obtained in (a) with a zinc source and a solution comprising a tellurium source, a reducing agent, and a zinc carboxylate;
to provide a ZnSe$_{1-x}$Te$_x$ nanocrystal.

In some embodiments, the method further comprises:
  (c) contacting the reaction mixture in (b) with a zinc source and a selenium source;
to provide a ZnSe$_{1-x}$Te$_x$ nanocrystal.

In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source is trioctylphosphine selenide (TOPSe).

In some embodiments, the zinc source is a dialkyl zinc compound. In some embodiments, the zinc source is diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, or zinc sulfate. In some embodiments, the zinc source is diethylzinc or dimethylzinc. In some embodiments, the zinc source is diethylzinc.

In some embodiments, a solution comprising a tellurium source, a reducing agent, and a zinc carboxylate is prepared separately. In some embodiments, a solution comprising a tellurium source, a reducing agent, and a zinc carboxylate is prepared in situ.

In some embodiments, the zinc carboxylate is produced by reacting a zinc salt and a carboxylic acid.

In some embodiments, the zinc salt is selected from zinc acetate, zinc fluoride, zinc chloride, zinc bromide, zinc iodide, zinc nitrate, zinc triflate, zinc tosylate, zinc mesylate, zinc oxide, zinc sulfate, zinc acetylacetonate, zinc toluene-3,4-dithiolate, zinc p-toluenesulfonate, zinc diethyldithiocarbamate, zinc dibenzyldithiocarbamate, and mixtures thereof.

In some embodiments, the carboxylic acid is selected from acetic acid, propionic acid, butyric acid, valeric acid, caproic acid, heptanoic acid, caprylic acid, capric acid, undecanoic acid, lauric acid, myristic acid, palmitic acid, stearic acid, behenic acid, acrylic acid, methacrylic acid, but-2-enoic acid, but-3-enoic acid, pent-2-enoic acid, pent-4-enoic acid, hex-2-enoic acid, hex-3-enoic acid, hex-4-enoic acid, hex-5-enoic acid, hept-6-enoic acid, oct-2-enoic acid, dec-2-enoic acid, undec-10-enoic acid, dodec-5-enoic acid, oleic acid, gadoleic acid, erucic acid, linoleic acid, α-linolenic acid, calendic acid, eicosadienoic acid, eicosatrienoic acid, arachidonic acid, stearidonic acid, benzoic acid, para-toluic acid, ortho-toluic acid, meta-toluic acid, hydrocinnamic acid, naphthenic acid, cinnamic acid, para-toluenesulfonic acid, and mixtures thereof.

In some embodiments, the zinc carboxylate is zinc stearate or zinc oleate. In some embodiments, the zinc carboxylate is zinc oleate.

In some embodiments, the tellurium source is selected from trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof. In some embodiments, the tellurium source is trioctylphosphine telluride (TOPTe).

In some embodiments, the reducing agent is selected from diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride. In some embodiments, the reducing agent is lithium triethylborohydride.

From density functional theory (DFT) calculations it is known that localization of Te atoms in the center of the ZnSe core would result in a sufficient red shift while maintaining a type-I electron-hole overlap. As described in U.S. Pat. No. 8,637,082, varying the location and number of Te atoms across the quantum dot ensemble can result in peak broadening. TOPTe is known to decompose to elemental Te, which is then only slowly reduced to Te$^{2-}$. This reaction is not matched to that between diethyl zinc and TOPSe and results in low and poorly controlled incorporation of Te atoms into ZnSe. As described in Zhang, J., et al., *J. Phys. Chem. C* 112:5454-5458 (2008), improved ZnTe nanomaterials result from the use of a strong reducing agent in conjunction with TOPTe to promote the formation of Te$^{2-}$. The use of zinc carboxylates instead of diethyl zinc prevents formation of elemental zinc.

In some embodiments, a solution comprising a tellurium source, a reducing agent, and a zinc carboxylate is prepared separately. In some embodiments, the method for preparing the tellurium solution comprises:
  (a) admixing a tellurium source and a ligand to produce a reaction mixture;
  (b) contacting the reaction mixture in (a) with a reducing agent; and
  (c) contacting the reaction mixture in (b) with a zinc carboxylate;
to produce a tellurium solution.

In some embodiments, the mole percentage of tellurium source to zinc source is between about 1% and about 14%, about 1% and about 12%, about 1% and about 10%, about 1% and about 8%, about 1% and about 6%, about 1% and about 4%, about 1% and about 2%, about 2% and about 14%, about 2% and about 12%, about 2% and about 10%, about 2% and about 8%, about 2% and about 6%, about 2% and about 4%, about 4% and about 14%, about 4% and about 12%, about 4% and about 10%, about 4% and about 8%, about 4% and about 6%, about 6% and about 14%, about 6% and about 12%, about 6% and about 10%, about 6% and about 8%, about 8% and about 14%, about 8% and about 12%, about 8% and about 10%, about 10% and about 14%, about 10% and about 12%, or about 12% and about 14%. In some embodiments, the mole percentage of tellurium source to zinc source is between about 6% and about 10%. In some embodiments, the mole percentage of tellurium source to zinc source is about 8%.

In some embodiments, the ZnSe$_{1-x}$Te$_x$ core is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligand are disclosed in U.S. Patent Application Publication Nos. 2005/0205849, 2008/0105855, 2008/0118755, 2009/0065764, 2010/0140551, 2013/0345458, 2014/0151600, 2014/0264189, and 2014/0001405.

In some embodiments, ligands suitable for the synthesis of nanostructure cores, including $ZnSe_{1-x}Te_x$ cores, are known by those of skill in the art. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine.

In some embodiments, the core is produced in the presence of a mixture of ligands. In some embodiments, the core is produced in the presence of a mixture comprising 2, 3, 4, 5, or 6 different ligands. In some embodiments, the core is produced in the presence of a mixture comprising 3 different ligands. In some embodiments, the mixture of ligands comprises oleylamine, diphenylphosphine, and trioctylphosphine.

In some embodiments, a selenium source and a ligand are admixed at a reaction temperature between 250° C. and 350° C., 250° C. and 320° C., 250° C. and 300° C., 250° C. and 290° C., 250° C. and 280° C., 250° C. and 270° C., 270° C. and 350° C., 270° C. and 320° C., 270° C. and 300° C., 270° C. and 290° C., 270° C. and 280° C., 280° C. and 350° C., 280° C. and 320° C., 280° C. and 300° C., 280° C. and 290° C., 290° C. and 350° C., 290° C. and 320° C., 290° C. and 300° C., 300° C. and 350° C., 300° C. and 320° C., or 320° C. and 350° C. In some embodiments, a selenium source and a ligand are admixed at a reaction temperature of about 300° C.

In some embodiments, the reaction mixture after admixing a selenium source and a ligand is maintained at an elevated temperature for between 2 and 20 minutes, 2 and 15 minutes, 2 and 10 minutes, 2 and 8 minutes, 2 and 5 minutes, 5 and 20 minutes, 5 and 15 minutes, 5 and 10 minutes, 5 and 8 minutes, 8 and 20 minutes, 8 and 15 minutes, 8 and 10 minutes, 10 and 20 minutes, 10 and 15 minutes, or 15 and 20 minutes.

In some embodiments, a zinc source and a solution comprising a tellurium source, a reducing agent, and a zinc carboxylate are added to the reaction mixture. In some embodiments, a zinc source and a solution comprising a tellurium source, a reducing agent, and a zinc carboxylate are added to the reaction mixture at a reaction temperature between 250° C. and 350° C., 250° C. and 320° C., 250° C. and 300° C., 250° C. and 290° C., 250° C. and 280° C., 250° C. and 270° C., 270° C. and 350° C., 270° C. and 320° C., 270° C. and 300° C., 270° C. and 290° C., 270° C. and 280° C., 280° C. and 350° C., 280° C. and 320° C., 280° C. and 300° C., 280° C. and 290° C., 290° C. and 350° C., 290° C. and 320° C., 290° C. and 300° C., 300° C. and 350° C., 300° C. and 320° C., or 320° C. and 350° C. In some embodiments, a zinc source and a solution comprising a tellurium source, a reducing agent, and a zinc carboxylate are added to a mixture of ligand source and selenium source at a reaction temperature of about 300° C.

In some embodiments, the reaction mixture—after addition of a zinc source and a solution comprising a tellurium source, a reducing agent, and a zinc carboxylate—is maintained at an elevated temperature for between 2 and 20 minutes, 2 and 15 minutes, 2 and 10 minutes, 2 and 8 minutes, 2 and 5 minutes, 5 and 20 minutes, 5 and 15 minutes, 5 and 10 minutes, 5 and 8 minutes, 8 and 20 minutes, 8 and 15 minutes, 8 and 10 minutes, 10 and 20 minutes, 10 and 15 minutes, or 15 and 20 minutes.

In some embodiments, the reaction mixture—after addition of a zinc source and a solution comprising a tellurium source, a reducing agent, and a zinc carboxylate—is contacted with a zinc source and a selenium source. In some embodiments, the zinc source and the selenium source are added to the reaction mixture at a reaction temperature between 250° C. and 350° C., 250° C. and 320° C., 250° C. and 300° C., 250° C. and 290° C., 250° C. and 280° C., 250° C. and 270° C., 270° C. and 350° C., 270° C. and 320° C., 270° C. and 300° C., 270° C. and 290° C., 270° C. and 280° C., 280° C. and 350° C., 280° C. and 320° C., 280° C. and 300° C., 280° C. and 290° C., 290° C. and 350° C., 290° C. and 320° C., 290° C. and 300° C., 300° C. and 350° C., 300° C. and 320° C., or 320° C. and 350° C. In some embodiments, a zinc source and a selenium source are added to the reaction mixture at a reaction temperature of about 280° C.

In some embodiments, the zinc source and the selenium source are added over a period of between 2 and 120 minutes, 2 and 60 minutes, 2 and 30 minutes, 2 and 20 minutes, 2 and 15 minutes, 2 and 10 minutes, 2 and 8 minutes, 2 and 5 minutes, 5 and 120 minutes, 5 and 60 minutes, 5 and 30 minutes, 5 and 20 minutes, 5 and 15 minutes, 5 and 10 minutes, 5 and 8 minutes, 8 and 120 minutes, 8 and 60 minutes, 8 and 30 minutes, 8 and 20 minutes, 8 and 15 minutes, 8 and 10 minutes, 10 and 120 minutes, 10 and 60 minutes, 10 and 30 minutes, 10 and 20 minutes, 10 and 15 minutes, 15 and 120 minutes, 15 and 60 minutes, 15 and 30 minutes, 15 and 20 minutes, 20 and 120 minutes, 20 and 60 minutes, 20 and 30 minutes, 30 and 120 minutes, 30 and 60 minutes, or 60 and 120 minutes. In some embodiments, the zinc source and the selenium source are added over a period of 20 and 30 minutes.

In some embodiments, the reaction mixture—after addition of a zinc source and a selenium source—is maintained at an elevated temperature for between 2 and 20 minutes, 2 and 15 minutes, 2 and 10 minutes, 2 and 8 minutes, 2 and 5 minutes, 5 and 20 minutes, 5 and 15 minutes, 5 and 10 minutes, 5 and 8 minutes, 8 and 20 minutes, 8 and 15 minutes, 8 and 10 minutes, 10 and 20 minutes, 10 and 15 minutes, or 15 and 20 minutes. In some embodiments, the reaction mixture—after addition of a zinc source and a selenium source—is maintained at an elevated temperature for between 2 and 10 minutes.

To prevent precipitation of the $ZnSe_{1-x}Te_x$ cores as additional precursors are added, additional ligand can be added during the growth phase. If too much ligand is added during the initial nucleation phase, the concentration of the zinc source, selenium source, and tellurium source would be too low and would prevent effective nucleation. Therefore, the ligand is added slowly throughout the growth phase. In some embodiments, the additional ligand is oleylamine.

After the $ZnSe_{1-x}Te_x$ cores reach the desired thickness and diameter, they can be cooled. In some embodiments, the $ZnSe_{1-x}Te_x$ cores are cooled to room temperature. In some embodiments, an organic solvent is added to dilute the reaction mixture comprising the $ZnSe_{1-x}Te_x$ cores.

In some embodiments, the organic solvent is hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, the $ZnSe_{1-x}Te_x$ cores are isolated. In some embodiments, the $ZnSe_{1-x}Te_x$ cores are isolated by precipitation of the $ZnSe_{1-x}Te_x$ from solvent. In some embodiments, the $ZnSe_{1-x}Te_x$ cores are isolated by precipitation with ethanol.

In some embodiments, the $ZnSe_{1-x}Te_x$ cores of the nanostructure of the present invention have a molar ratio of zinc to selenium of between about 1:1 and about 1:0.8, about 1:1 and about 1:0.9, about 1:1 and about 1:0.92, or about 1:1 and about 1:0.94.

In some embodiments, the $ZnSe_{1-x}Te_x$ cores of the nanostructure of the present invention have a molar ratio of zinc to tellurium of between about 1:0.05 and about 1:0.01, about 1:0.05 and about 1:0.02, about 1:0.05 and about 1:0.03, about 1:0.03 and about 1:0.01, about 1:0.03 and about 1:0.02, or about 1:0.02 and about 1:0.01.

Production of a Shell

In some embodiments, the nanostructures of the present invention include a core and at least one shell. In some embodiments, the nanostructures of the present invention include a core and at least two shells. The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell deposited is a mixture of at least two of a zinc source, a selenium source, a sulfur source, a tellurium source, and a cadmium source. In some embodiments, the shell deposited is a mixture of two of a zinc source, a selenium source, a sulfur source, a tellurium source, and a cadmium source. In some embodiments, the shell deposited is a mixture of three of a zinc source, a selenium source, a sulfur source, a tellurium source, and a cadmium source. In some embodiments, the shell comprises zinc and sulfur; zinc and selenium; zinc, sulfur, and selenium; zinc and tellurium zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur: cadmium, zinc, and selenium; or cadmium, zinc, sulfur, and selenium.

In some embodiments, a shell comprises more than one monolayer of shell material. The number of monolayers is an average for all the nanostructures; therefore, the number of monolayers in a shell may be a fraction. In some embodiments, the number of monolayers in a shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5.2 and 4, 2 and 3, 3 and 10, 3 and 8, 3 and 7, 3 and 6, 3 and 5, 3 and 4.4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the shell comprises between 3 and 5 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM. In some embodiments, each shell has a thickness of between 0.05 nm and 3.5 nm, 0.05 nm and 2 nm, 0.05 nm and 0.9 nm, 0.05 nm and 0.7 nm, 0.05 nm and 0.5 nm, 0.05 nm and 0.3 nm, 0.05 nm and 0.1 nm, 0.1 nm and 3.5 nm, 0.1 nm and 2 nm, 0.1 nm and 0.9 nm, 0.1 nm and 0.7 nm, 0.1 nm and 0.5 nm, 0.1 nm and 0.3 nm, 0.3 nm and 3.5 nm, 0.3 nm and 2 nm, 0.3 nm and 0.9 nm, 0.3 nm and 0.7 nm, 0.3 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Appl. Publication No. 2008/0118755.

Ligands suitable for the synthesis of a shell are known by those of skill in the art. In some embodiments, the ligand is a fatty acid selected from the group consisting of lauric acid, caproic acid, caprylic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is trioctylphosphine oxide, trioctylphosphine, or lauric acid.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine oxide, trioctylphosphine, and lauric acid.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether.

In some embodiments, a core or a core/shell(s) and shell precursor are admixed at an temperature between 20° C. and 310° C., 20° C. and 280° C., 20° C. and 250° C., 20° C. and 200° C., 20° C. and 150° C., 20° C. and 100° C., 20° C. and 50° C., 50° C. and 310° C., 50° C. and 280° C., 50° C. and 250° C., 50° C. and 200° C., 50° C. and 150° C., 50° C. and 100° C., 100° C. and 310° C., 100° C. and 280° C., 100° C. and 250° C., 100° C. and 200° C., 100° C. and 150° C., 150° C. and 310° C., 150° C. and 280° C., 150° C. and 250° C., 150° C. and 200° C., 200° C. and 310° C., 200° C. and 280° C., 200° C. and 250° C., 250° C. and 310° C., 250° C. and 280° C., or 280° C. and 310° C. In some embodiments, a core or a core/shell(s) and shell precursor are admixed at a temperature between 20° C. and 100° C.

In some embodiments, after admixing a core or core/shell(s) and shell precursor, the temperature of the reaction mixture is increased to an elevated temperature between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C., or 280° C. and 310° C. In some embodiments, after contacting a core or core/shell(s) and shell precursor, the temperature of the reaction mixture is increased to between 250° C. and 310° C.

In some embodiments, after admixing a core or core/shell(s) and shell precursor, the time for the temperature to reach the elevated temperature is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, after admixing a core or core/shell(s) and shell precursor, the temperature of the reaction mixture is maintained at an elevated temperature for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes. In some embodiments, after admixing a core or core/shell(s) and shell precursor, the temperature of the reaction mixture is maintained at an elevated temperature for between 30 and 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, core/shell(s) nanostructures are isolated. In some embodiments, the core/shell(s) nanostructures are isolated by precipitation using an organic solvent. In some embodiments, the core/shell(s) nanostructures are isolated by flocculation with ethanol.

The number of monolayers will determine the size of the core/shell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between 1 nm and 15 nm, 1 nm and 10 nm, 1 nm and 9 nm, 1 nm and 8 nm, 1 nm and 7 nm, 1 nm and 6 nm, 1 nm and 5 nm, 5 nm and 15 nm, 5 nm and 10 nm, 5 nm and 9 nm, 5 nm and 8 nm, 5 nm and 7 nm, 5 nm and 6 nm, 6 nm and 15 nm, 6 nm and 10 nm, 6 nm and 9 nm, 6 nm and 8 nm, 6 nm and 7 nm, 7 nm and 15 nm, 7 nm and 10 nm, 7 nm and 9 nm, 7 nm and 8 nm, 8 nm and 15 nm, 8 nm and 10 nm, 8 nm and 9 nm, 9 nm and 15 nm, 9 nm and 10 nm, or 10 nm and 15 nm. In some embodiments, the core/shell(s) nanostructures have an average diameter of between 6 nm and 7 nm.

In some embodiments, the core/shell(s) nanostructure is subjected to an acid etching step before deposition of an additional shell.

Production of a ZnSe Shell

In some embodiments, the shell deposited onto the core or core/shell(s) nanostructure is a ZnSe shell.

In some embodiments, the shell precursors contacted with a core or core/shell(s) nanostructure to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the molar ratio of core to zinc source to prepare a ZnSe shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the molar ratio of core to selenium source to prepare a ZnSe shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the number of monolayers in a ZnSe shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnSe shell comprises between 2 and 6 monolayers. In some embodiments, the ZnSe shell comprises between 3 and 5 monolayers.

In some embodiments, a ZnSe monolayer has a thickness of about 0.328 nm.

In some embodiments, a ZnSe shell has a thickness of between 0.08 nm and 3.5 nm, 0.08 nm and 2 nm, 0.08 nm and 0.9 nm, 0.08 nm and 0.7 nm, 0.08 nm and 0.5 nm, 0.08 nm and 0.2 nm, 0.2 nm and 3.5 nm, 0.2 nm and 2 nm, 0.2 nm and 0.9 nm, 0.2 nm and 0.7 nm, 0.2 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

Production of a ZnS Shell

In some embodiments, the shell deposited onto the core or core/shell(s) nanostructure is a ZnS shell.

In some embodiments, the shell precursors contacted with a core or core/shell(s) nanostructure to prepare a ZnS shell comprise a zinc source and a sulfur source.

In some embodiments, the ZnS shell passivates defects at the particle surface, which leads to an improvement in the quantum yield and to higher efficiencies when used in devices such as LEDs and lasers. Furthermore, spectral impurities which are caused by defect states may be eliminated by passivation, which increases the color saturation.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In some embodiments, the sulfur source is octanethiol. In some embodiments, the sulfur source is tributylphosphine sulfide.

In some embodiments, the molar ratio of core to zinc source to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the molar ratio of core to sulfur source to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the number of monolayers in a ZnS shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnS shell comprises between 2 and 12 monolayers. In some embodiments, the ZnS shell comprises between 4 and 6 monolayers.

In some embodiments, a ZnS monolayer has a thickness of about 0.31 nm.

In some embodiments, a ZnS shell has a thickness of between 0.08 nm and 3.5 nm, 0.08 nm and 2 nm, 0.08 nm and 0.9 nm, 0.08 nm and 0.7 nm, 0.08 nm and 0.5 nm, 0.08 nm and 0.2 nm, 0.2 nm and 3.5 nm, 0.2 nm and 2 nm, 0.2 nm and 0.9 nm, 0.2 nm and 0.7 nm, 0.2 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

Core/Shell(s) Nanostructures

In some embodiments, the core/shell(s) nanostructure is a $ZnSe_{1-x}Te_x/ZnSeZnS$ core/shell nanostructure. In some embodiments, the core/shell(s) nanostructure is a $ZnSe_{1-x}Te_x/ZnSeZnS$ core/shell quantum dot.

In some embodiments, the core/shell(s) nanostructures display a high photoluminescence quantum yield. In some embodiments, the core/shell(s) nanostructures display a photoluminescence quantum yield of between 30% and 99%, 30% and 95%, 30% and 90%, 30% and 85%, 30% and 80%, 30% and 60%, 30% and 50%, 30% and 40%/o, 40% and 99%, 40% and 95%, 40% and 90%, 40%0 and 85%, 400/and 80%, 40% and 60%, 40% and 50%, 50% and 99%, 50% and 95%, 50% and 90%, 50% and 85%, 60% and 99%, 60% and 95%, 60% and 85%, 80% and 99%, 80% and 90%, 80% and 85%, 85% and 99%, or 85% and 95%. In some embodiments, the core/shell(s) nanostructures display a photoluminescence quantum yield of between 50% and 60%.

In some embodiments, the photoluminescence spectrum for the core/shell(s) nanostructures have a emission maximum between 300 nm and 590 nm, 300 nm and 550 nm, 300 nm and 450 nm, 450 nm and 590 nm, 450 nm and 550 nm, or 550 nm and 590. In some embodiments, the photoluminescence spectrum for the core/shell(s) nanostructures has an emission maximum of between 450 nm and 590 nm. In some embodiments, the photoluminescence spectrum for the core/shell(s) nanostructures has an emission maximum of between 450 nm and 460 nm.

The size distribution of the core/shell(s) nanostructures can be relatively narrow. In some embodiments, the photoluminescence spectrum of the population or core/shell(s) nanostructures can have a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population or core/shell(s) nanostructures can have a full width at half maximum of between 20 nm and 30 nm.

The resulting core/shell(s) nanostructures are optionally embedded in a matrix (e.g., an organic polymer, silicon-containing polymer, inorganic, glassy, and/or other matrix), used in production of a nanostructure phosphor, and/or incorporated into a device, e.g., an LED, backlight, downlight, or other display or lighting unit or an optical filter. Exemplary phosphors and lighting units can, e.g., generate a specific color light by incorporating a population of nanostructures with an emission maximum at or near the desired wavelength or a wide color gamut by incorporating two or more different populations of nanostructures having different emission maxima. A variety of suitable matrices are known in the art. See, e.g., U.S. Pat. No. 7,068,898 and U.S. Patent Appl. Publication Nos. 2010/0276638, 2007/0034833, and 2012/0113672. Exemplary nanostructure phosphor films, LEDs, backlighting units, etc. are described, e.g., in U.S. Patent Appl. Publications Nos. 2010/0276638, 2012/0113672, 2008/0237540, 2010/0110728, and 2010/0155749 and U.S. Pat. Nos. 7,374,807, 7,645,397, 6,501,091, and 6,803,719.

Core/shell(s) nanostructures resulting from the methods are also a feature of the invention. Thus, one class of embodiments provides a population of core/shell(s) nanostructures. In some embodiments, the core/shell(s) nanostructures are quantum dots.

Nanostructure Layer

In some embodiments, the present disclosure provides a nanostructure layer comprising at least one population of nanostructures, wherein the nanostructure comprises a $ZnSe_{1-x}Te_x$ core and at least one shell, wherein 0<x<1 and the at least one shell comprises ZnS or ZnSe.

In some embodiments, the FWHM of the nanostructure is between about 15 and about 30.

In some embodiments, the nanostructure is a quantum dot.

Molded Article

In some embodiments, the present disclosure provides a molded article comprising at least one population of nanostructures, wherein the nanostructure comprises a $ZnSe_{1-x}Te_x$ core and at least one shell, wherein 0<x<1 and the at least one shell comprises ZnS or ZnSe.

In some embodiments, the FWHM of the nanostructure is between about 15 and about 30.

In some embodiments, the molded article is a film, a substrate for a display, or a light emitting diode.

In some embodiments, the nanostructure is a quantum dot.

In some embodiments, the present disclosure provides a molded article comprising:
  (a) a first barrier layer;
  (b) a second barrier layer; and
  (c) a nanostructure layer between the first barrier layer and the second barrier layer, wherein the nanostructure comprises a ZnSe1–xTex core and at least one shell, wherein 0<x<1 and the at least one shell comprises ZnS or ZnSe.

In some embodiments, the FWHM of the molded article is between about 15 and about 30.

In some embodiments, the molded article is a quantum dot.

Making a Nanostructure Layer

In some embodiments, the nanostructure layer can be embedded in a polymeric matrix. As used herein, the term "embedded" is used to indicate that the nanostructure population is enclosed or encased with the polymer that makes up the majority of the components of the matrix. In some embodiments, at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, a nanostructure composition is deposited to form a nanostructure layer. In some embodiments, a nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

In some embodiments, the nanostructure layer is cured after deposition. Suitable curing methods include photo-curing, such as UV curing, and thermal curing. Traditional laminate film processing methods, tape-coating methods, and/or roll-to-roll fabrication methods can be employed in forming a nanostructure layer.

Spin Coating

In some embodiments, the nanostructure composition is deposited onto a substrate using spin coating. In spin coating a small amount of material is typically deposited onto the center of a substrate loaded onto a machine called the spinner which is secured by a vacuum. A high speed of rotation is applied on the substrate through the spinner which causes centripetal force to spread the material from the center to the edge of the substrate. While most of the material is spun off, a certain amount remains of the substrate, forming a thin film of material on the surface as the rotation continues. The final thickness of the film is determined by the nature of the deposited material and the substrate in addition to the parameters chosen for the spin process such as spin speed, acceleration, and spin time. In some embodiments, a spin speed of 1500 to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to a wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," *ESC Transactions* 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the nanostructure composition is water, organic solvents, inorganic solvents, halogenated organic solvents, or mixtures thereof. Illustrative solvents include, but are not limited to, water, $D_2O$, acetone, ethanol, dioxane, ethyl acetate, methyl ethyl ketone, isopropanol, anisole, γ-butyrolactone, dimethylformamide, N-methylpyrrolidinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the nanostructure compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum dot film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Barrier Layers

In some embodiments, the molded article comprises one or more barrier layers disposed on either one or both sides of the nanostructure layer. Suitable barrier layers protect the nanostructure layer and the molded article from environmental conditions such as high temperatures, oxygen, and moisture. Suitable barrier materials include non-yellowing, transparent optical materials which are hydrophobic, chemically and mechanically compatible with the molded article, exhibit photo- and chemical-stability, and can withstand high temperatures. In some embodiments, the one or more barrier layers are index-matched to the molded article. In some embodiments, the matrix material of the molded article and the one or more adjacent barrier layers are index-matched to have similar refractive indices, such that most of the light transmitting through the barrier layer toward the molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In some embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the molded article according to one embodiment. Suitable barrier materials include any suitable barrier materials known in the art. In some embodiments, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 µm, 100 µm or less, or 50 µm or less.

Each barrier layer of the molded article can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Nanostructure Layer Features and Embodiments

In some embodiments, the nanostructure layers are used to form display devices. As used herein, a display device refers to any system with a lighting display. Such devices include, but are not limited to, devices encompassing a liquid crystal display (LCD), televisions, computers, mobile phones, smart phones, personal digital assistants (PDAs), gaming devices, electronic reading devices, digital cameras, and the like.

Molded Articles with Improved Properties

In some embodiments, a molded article prepared using the nanostructures shows an EQE of between about 1.5% and about 20%, about 1.5% and about 15%, about 1.5% and about 12%, about 1.5% and about 10%, about 1.5% and about 8%, about 1.5% and about 4%, about 1.5% and about 3%, about 3% and about 20%, about 3% and about 15%, about 3% and about 12%, about 3% and about 10%, about 3% and about 8%, about 8% and about 20%, about 8% and about 15%, about 8% and about 12%, about 8% and about 10%, about 10% and about 20%, about 10% and about 15%, about 10% and about 12%, about 12% and about 20%, about 12% and about 15%, or about 15% and about 20%. In some embodiments, the nanostructure is a quantum dot. In some embodiments, the molded article is a light emitting diode.

In some embodiments, a molded article prepared using the nanostructures shows a photoluminescence spectrum with an emission maximum of between 450 nm and 550 nm. In some embodiments, a molded article prepared using the nanostructures shows a photoluminescence spectrum with an emission maximum of between 450 nm and 460 nm.

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

EXAMPLES

Example 1

Synthesis of $ZnSe_{1-x}Te_x$ Alloy Nanostructures Using TOPTe ("Old Precursor")

Oleylamine (15 mL) was added to a 100 mL three-neck flask and degassed under vacuum at 80° C. for 60 minutes. The mixture was heated to 300° C. under nitrogen flow. At this temperature a solution of trioctylphosphine selenide (TOPSe, 2.3 mmol), trioctylphosphine telluride (TOPTe, 0.6 mmol), and diphenylphosphine (225 µL) in trioctylphosphine (TOP, 2.9 mL total) was added to the flask. Once the temperature rebounded to 300° C., a solution of diethyl zinc (295 µL) in TOP (2.5 mL) was quickly injected. The temperature was set to 280° C. and after 5 minutes an infusion of a solution of diethylzinc (1.38 mL) and TOPSe (20.2 mmol) in TOP (18 mL total) was started at a rate of 1 mL/minute with a 10 minute break after 3.7 mL and a 15 minute break after 9.5 mL. Additional oleylamine (20 mL) was infused at a rate of 1.5 mL/minute starting 26 minutes after the zinc injection. After the infusion was finished the reaction mixture was held at 280° C. for 15 minutes and then cooled to room temperature. The growth solution was then diluted with an equal volume of toluene (65 mL), and the nanocrystals were precipitated by addition of ethanol (130 mL). After centrifugation the supernatant was discarded, and the nanocrystals were re-dispersed in hexane (40 mL). The concentration was measured as the dry weight by evaporating the solvent from an aliquot. The dried material was further subjected to thermogravimetric analysis to determine the inorganic content.

Example 2

Synthesis of $ZnSe_{1-x}Te_x$ Alloy Nanostructures Using TOPTe ("New Precursor")

The new TOPTe precursor mixture was prepared by first diluting TOPTe (1 M Te, 230 µL) with 2.5 mL dried and distilled oleylamine. Lithium triethylborohydride (1 M in THF, 230 µL) was added to this solution which resulted in a deeply purple solution. Finally, zinc oleate (0.5 M in TOP, 460 µL) was added which resulted in a colorless opaque viscous gel which can be drawn into a syringe.

Oleylamine (15 mL) was added to a 100 mL three-neck flask and degassed under vacuum at 110° C. for 30 minutes. The mixture was heated to 300° C. under nitrogen flow. Once this temperature was reached, a solution of trioctylphosphine selenide (TOPSe, 2.7 mmol) and diphenylphosphine (225 µL) in TOP (2.9 mL total) was added to the flask. Once the temperature rebounded to 300° C., the new TOPTe precursor formulation described above and a solution of diethyl zinc (295 µL) in TOP (1 mL) were quickly injected from separate syringes. The temperature was set to 280° C. and after 5 minutes an infusion of a solution of diethylzinc (760 µL) and TOPSe (11.1 mmol) in TOP (10 mL total) was started at a rate of 1 mL/minute with a 10 minute break after addition of 3.8 mL. After the precursor infusion was finished the reaction mixture was held at 280° C. for 5 minutes and then cooled to room temperature. The growth solution was diluted with an equal volume of toluene (40 mL), and the nanocrystals were precipitated by addition of ethanol (120 mL). After centrifugation the supernatant was discarded, and the nanocrystals were re-dispersed in toluene (5 mL). The concentration was measured as the dry weight by evaporating the solvent off an aliquot. The dried material was further subjected to thermogravimetric analysis to determine the inorganic content.

Example 3

Synthesis of $ZnSe_{1-x}Te_x$/ZnSe/ZnS Core/Shell Nanostructures

Coating a ZnSe/ZnS multi-shell on $ZnSe_{1-x}Te$ alloy nanocrystals of 4.0 nm average diameter with a target shell thickness of 4 monolayers (ML) of ZnSe and 4 ML of ZnS was performed using the following procedure.

A 100 mL three-neck flask was charged with zinc oleate (6.03 g), lauric acid (3.85 g), and trioctylphosphine oxide (4.93 g). After three vacuum and nitrogen backfill cycles, TOP (9.9 mL) and a solution of $ZnSe_{1-x}Te_x$ cores (1.5 mL, 78.9 mg/mL in toluene) was added to the flask. The solution was degassed under vacuum at 100° C. for 20 minutes, and then heated to 310° C. under nitrogen flow, 10 minutes after this temperature was reached the slow infusion of TOPSe (9.5 mL, 0.3 M in TOP) with a rate of 0.19 mL/min was started. After the selenium infusion was finished, the reaction was held at 310° C. for 10 minutes. Then the infusion of tributylphosphine sulfide (16.9 mL, 0.4 M in TOP) at a rate of 0.42 mL/minute was started. After the sulfur infusion was finished the reaction was held at 310° C. for 10 minutes and then cooled to room temperature. The reaction mixture was diluted with toluene (50 mL). The core/shell nanocrystals were precipitated by addition of ethanol (100 mL) and then isolated by centrifugation, decantation of the supernatant, and redispersion of the nanocrystals in hexane (50 mL). The precipitation was repeated once with ethanol (50 mL), and the nanocrystals were finally re-dispersed in octane (7 mL). The solution was filtered through a polytetrafluoroethylene (PTFE) 0.22 μm syringe filter and the concentration was adjusted to 18 mg/mL after measuring the dry weight of an aliquot.

Example 4

Elemental Analysis of Nanostructures Prepared Using Old and New Precursor

Nanocrystal samples were analyzed by inductively coupled plasma optical emission spectrometry (ICP-OES) after digestion in nitric acid. The molar ratios normalized to zinc are shown in TABLE 1.

TABLE 1

| Description | Zn (molar ratio) | Se (molar ratio) | S (molar ratio) | Te (molar ratio) |
|---|---|---|---|---|
| Core, old precursor, 20 mol % input | 1 | 0.892 | 0 | 0.0211 |
| Core/shell, target 3/5 monolayers, old precursor | 1 | 0.344 | 0.563 | 0.0020 |
| Core, new precursor, 8 mol % input | 1 | 0.917 | 0 | 0.0206 |
| Core/shell, target 4/4 monolayers, new precursor | 1 | 0.568 | 0.360 | 0.0027 |

The similar tellurium content in the resulting nanocrystals show that the new tellurium precursor resulted in improved incorporation of tellurium into the nanocrystals because a significantly lower amount of tellurium was used for an otherwise identical core synthesis.

Example 5

Properties of the $ZnSe_{1-x}Te_x$/ZnSe/ZnS Quantum Dots

Figure 2:
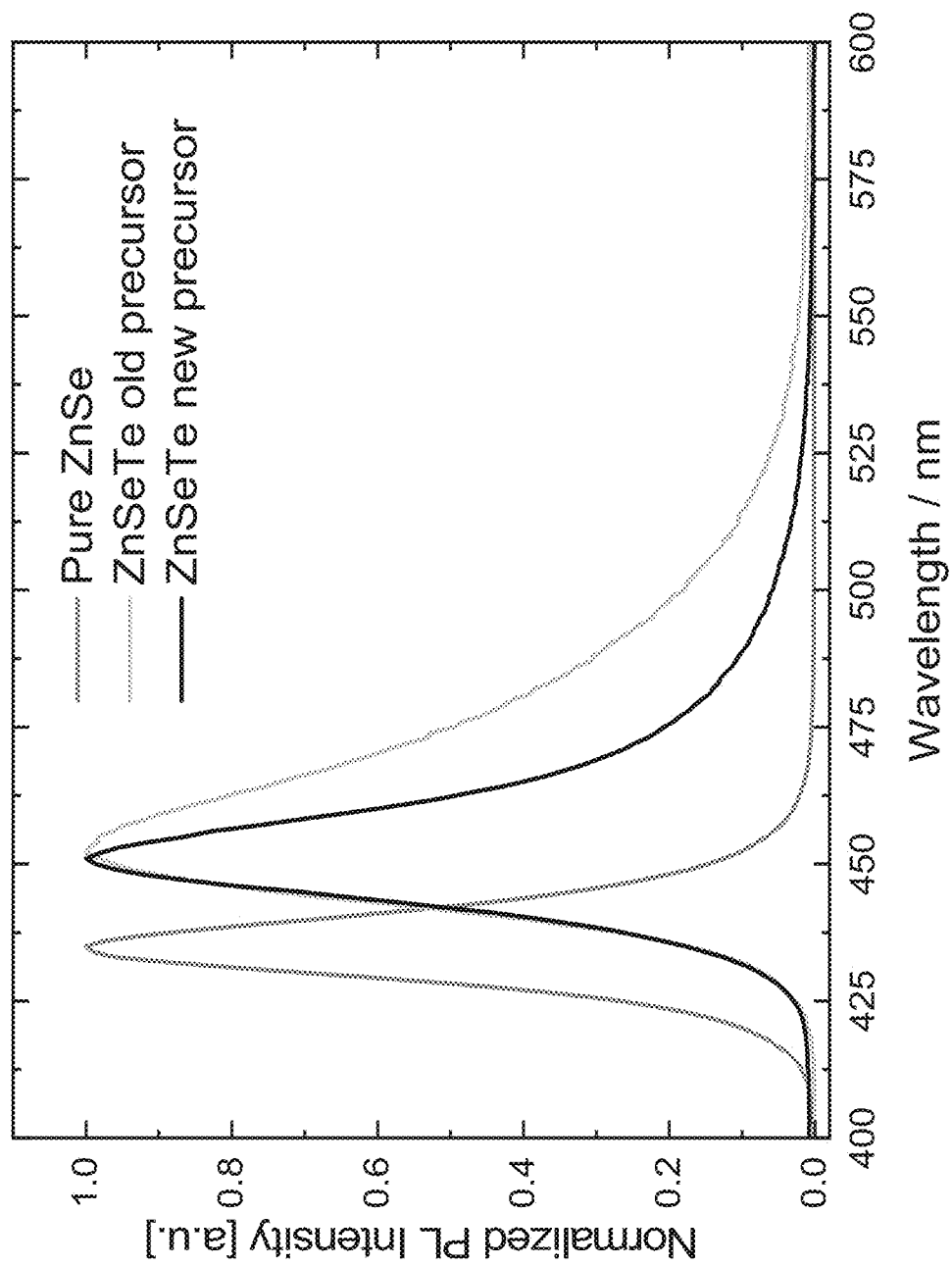
FIG. 2 shows photoluminescence spectra in solution for a ZnSe quantum dot, for a $ZnSe_{1-x}Te_x$ quantum dot prepared using the old tellurium precursor, and for a $ZnSe_{1-x}Te_x$ quantum dot prepared using the new tellurium precursor.

The solution photoluminescence spectra of the $ZnSe_{1-x}Te_x$/ZnSe/ZnS quantum dots is shown in FIG. 2. As shown in FIG. 2, a red shift is achieved with both tellurium precursors. The new formulation employing a reducing agent to generate $Te^{2-}$ and zinc oleate as a matching $Zn^{2+}$ precursor resulted in a narrower peak, because the formation of ZnTe was facilitated. The optical properties can be tuned by varying the number of shell monolayers and the amount of tellurium used as shown in TABLE 2.

TABLE 2

| Example | Te (mol %) | ZnSe Monolayers | ZnS Monolayers | PWL (nm) | FWHM (nm) | QY |
|---|---|---|---|---|---|---|
| 1 | 8 | 0 | 6 | 440 | 30 | 34% |
| 2 | 8 | 2 | 6 | 445 | 25 | 55% |
| 3 | 8 | 4 | 4 | 449 | 22 | 56% |
| 4 | 8 | 6 | 2 | 455 | 20 | 39% |
| 5 | 8 | 6 | 4 | 451 | 21 | 50% |
| 6 | 12 | 4 | 4 | 456 | 34 | 42% |

Example 6

Analysis of Electroluminescent Devices Prepared Using the Nanostructures

Devices were prepared by a combination of spin coating and thermal evaporation. Firstly, the hole injection material poly(3,4-ethylenedioxythiophene):poly(styrene sulfonate) (PEDOT:PSS) (50 nm) was spin coated onto a UV-ozone treated indium tin oxide (ITO) substrate and baked for 15 minutes at 200° C. The devices were transferred to an inert atmosphere and the hole transport material N,N'-di(naphthalen-1-yl)-N,N'-bis(4-vinylphenyl)biphenyl-4,4'-diamine (VNPB) (20 nm) was deposited by spin coating and baked at 200° C. for 15 minutes. A solution of either ZnSe/ZnS or $ZnSe_{1-x}Te_x$/ZnSe/ZnS quantum dots was deposited by spin coating, followed by spin coating of the electron transport material ZnMgO (20 nm). An Al cathode (150 nm) was then deposited by thermal evaporation followed by encapsulation of the device using a cap-glass, getter, and epoxy resin.

Figure 3:
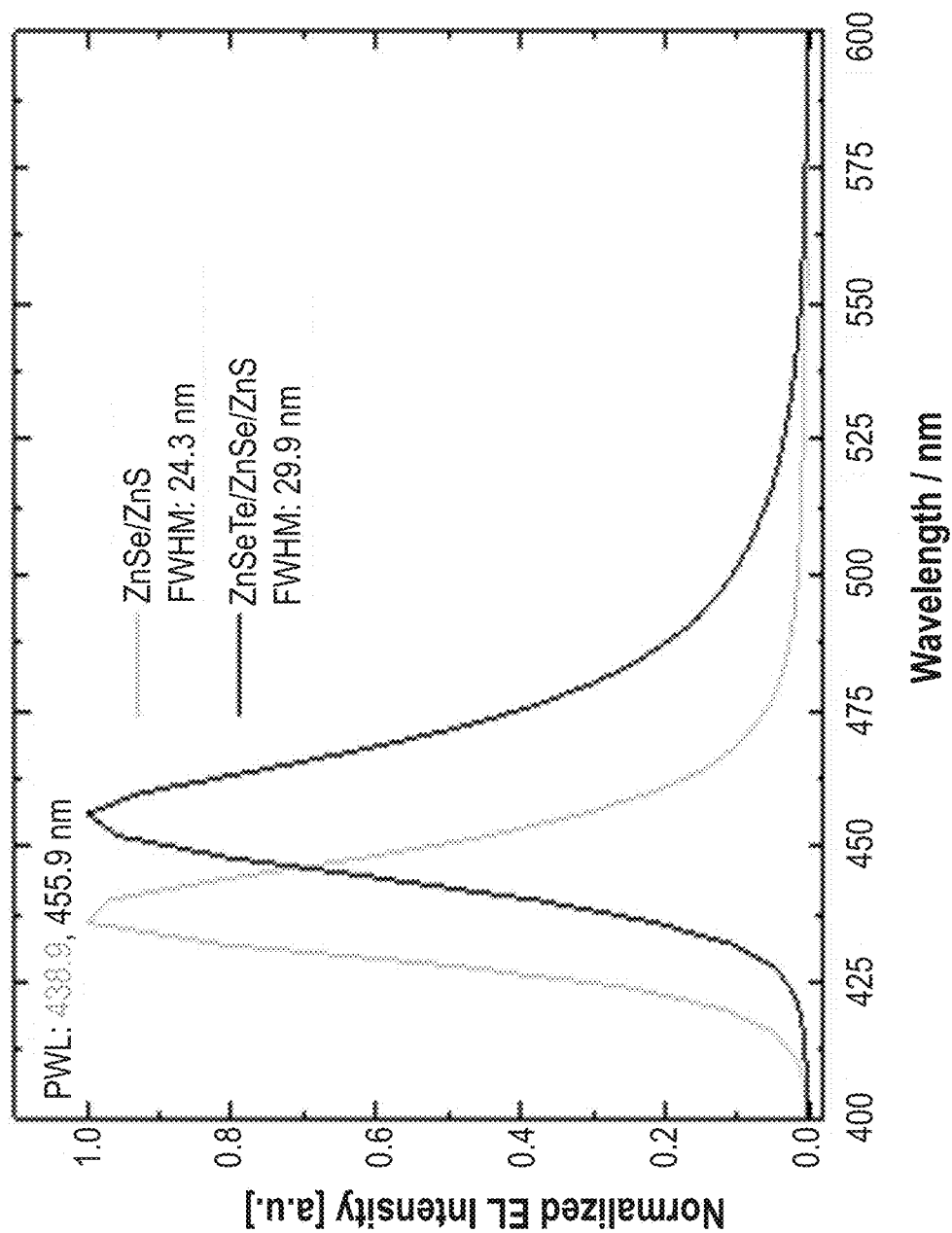
FIG. 3 shows electroluminescence spectra for a light emitting device prepared using a ZnSe/ZnS quantum dot and for a $ZnSe_{1-x}Te_x$/ZnSe/ZnS quantum dot prepared using the new tellurium precursor.

FIG. 3 shows electroluminescence spectra of light emitting devices prepared using pure ZnSe/ZnS quantum dots compared to light emitting devices prepared using $ZnSe_{1-x}Te_x$/ZnSe/ZnS quantum dots. The $ZnSe_{1-x}Te_x$ alloy cores enable electroluminescence in the 450-460 nm target range (with a peak emission wavelength (PWL) of 455.9) with a full width at half-maximum (FWHM) below 30 nm. The maximum device external quantum efficiency (EQE) obtained with light emitting devices prepared using the $ZnSe_{1-x}Te_x$/ZnSe/ZnS quantum dots was 2.0%. The CIE color-space coordinates (x and y) of x=0.145 and y=0.065 are relatively close to the BT.2020 blue primary of x=0.131 and y=0.046.

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A method of producing a $ZnSe_{1-x}Te_x$ nanocrystal comprising:
   (a) admixing a selenium source and at least one ligand to produce a reaction mixture; and
   (b) contacting the reaction mixture obtained in (a) with a zinc source and a solution comprising a tellurium source, a reducing agent, and a zinc carboxylate;
   to provide a $ZnSe_{1-x}Te_x$ nanocrystal.

2. The method of claim 1, wherein the selenium source in (a) is selected from the group consisting of trioctylphosphine selenide, tri(n-butyl)phosphine selenide, tri(secbutyl) phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

3. The method of claim 1, wherein the zinc source in (b) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

4. The method of claim 1, wherein the tellurium source in (b) is selected from the group consisting of trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof.

5. The method of claim 1, wherein the reducing agent in (b) is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride.

6. The method of claim 1, wherein the zinc carboxylate in (b) is selected from the group consisting of zinc oleate, zinc hexanoate, zinc octanoate, zinc laurate, zinc myristate, zinc palmitate, zinc stearate, zinc dithiocarbamate, or mixtures thereof.

7. The method of claim 1, further comprising:
   (c) contacting the reaction mixture in (b) with a zinc source and a selenium source.

8. The method of claim 7, wherein the zinc source in (c) is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate.

9. The method of claim 7, wherein the selenium source in (c) is selected from the group consisting of trioctylphosphine selenide, tri(n-butyl)phosphine selenide, tri(secbutyl) phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof.

10. The method of claim 1, wherein the selenium source in (a) is trioctylphosphine selenide, the zinc source in (b) is diethylzinc, the tellurium source in (b) is trioctylphosphine telluride, the reducing agent in (b) is lithium triethylborohydride, and the zinc carboxylate in (b) is zinc oleate.

11. The method of claim 7, wherein the selenium source in (a) and (c) is trioctylphosphine selenide, the zinc source in (b) and (c) is diethylzinc, the tellurium source in (b) is trioctylphosphine telluride, the reducing agent in (b) is lithium triethylborohydride, and the zinc carboxylate in (b) is zinc oleate.

* * * * *